United States Patent [19]

Masumoto et al.

[11] Patent Number: 5,323,410
[45] Date of Patent: Jun. 21, 1994

[54] SOLID-SOLUTION SEMICONDUCTOR LASER ELEMENT MATERIAL AND LASER ELEMENT INCLUDING PB, CA AND S

[75] Inventors: Katashi Masumoto; Katsumi Mochizuki; Naoji Nakamura; Seishi Abe, all of Sendai, Japan

[73] Assignee: The Foundation: The Research Institute of Electric and Magentic Alloys, Japan

[21] Appl. No.: 950,604

[22] Filed: Sep. 24, 1992

[30] Foreign Application Priority Data

Sep. 30, 1991 [JP] Japan ................................ 3-251656

[51] Int. Cl.$^5$ ............................................ H01S 3/19
[52] U.S. Cl. .................................... 372/43; 372/45
[58] Field of Search ............................ 372/45, 50, 43

[56] References Cited

U.S. PATENT DOCUMENTS 4,612,644  9/1986  Partin .................................. 372/44
5,119,388  6/1992  Feit et al. ............................ 372/50

FOREIGN PATENT DOCUMENTS 0385668  9/1990  European Pat. Off. .

OTHER PUBLICATIONS

Semiconductor Science and Technology, vol. 5, No. 3-S, Mar. 1990, London GB, pp. S12-S20, H. Preier "Physics and applications of IV-VI compound semiconductor lasers".
Proceedings of the Symposium of the Materials Research Society (vol. 90)-Materials for IR Detectors and Sources, 1-5 Dec., 1986, Boston, Mass., US, pp. 47-59, Dale L. Partin, "Preparation and applications of lead chalcogenide diode lasers".
Applied Physics Letters, vol. 58, No. 8, 25 Feb. 1991, New York, US, pp. 799-800, N. Koguchi et al., "Double-heterostructure Pb1-x-yCdxSryS/PbS/Pb1-x-yCdxSryS lasers grown by molecular beam epitaxy".
Japanese Journal of Applied Physics, vol. 28, No. 7, Jul. 1989, Tokyo, JP, pp. 1170-1173, Noboyuki Koguchi et al. "New quaternary semiconductor material Pb1-xCdxS1-ySey for lattice-matched heterostructure lasers with emission wavelength around 3 mum".
Journal of Vacuum Science and Technology: Part B, vol. 4, No. 2, Mar. 1986, New York, US, pp. 578-580, D. L. Partin et al., "Lead calcium telluride grown by molecular beam epitaxy".
Journal of Crystal Growth 81 (1987) 400-404, North-Holland, Amsterdam, "Double Heterostructure Pb1-xCdxS1-ySey/PbS/Pb1-xCdxS1-ySey Lasers Grown By Molecular Beam Epitaxy", N. Koguchi, T. Kiyosawa and S. Takahashi no month available.
Superlattices and Microstructures, vol. 1, No. 2, 1985, "Lead Salt Quantum Well Diode Lasers", Dale L. Partin, pp. 131-135 no month available.
Appl. Phys. Lett. 55(5), 31 Jul. 1989, ®1989 American Institute of Physics "Pb1-xSrxS/PbS double-heterostructure lasers prepared by hot-wall expitaxy", A. Ishida, K. Muramatsu, H. Takashiba and M. Fujiyasu, pp. 430-431.
Appl. Phys. Lett. 53(26), 26 Dec. 1988, ®1988 American Institute of Physics "Near-room-temperature operation of Pb1-xSrxSe infrared diode lasers using molecular beam epitaxy growth technique", Beate Spanger, U. Schiessl, A. Lambrcht, H. Bottner, and M. Tacke, pp. 2582-2583.

Primary Examiner—John D. Lee
Assistant Examiner—Robert McNutt
Attorney, Agent, or Firm—Parkhurst, Wendel & Rossi

[57] ABSTRACT

The present invention relates to a solid solution semiconductor laser element material which can be used for a laser element which oscillates within an inflated region of wavelength range of 0.4-8 μm, can vary wavelength and can be operable in the vicinity of room temperature. The present invention more particularly relates to a material which can be used for a laser element having a lattice matching type double hetero-structure or lattice matching type quantum well structure.

20 Claims, 3 Drawing Sheets

FIG_1A
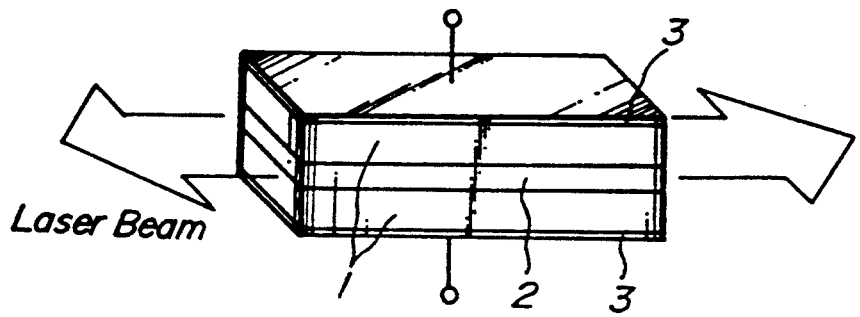
FIG_1B
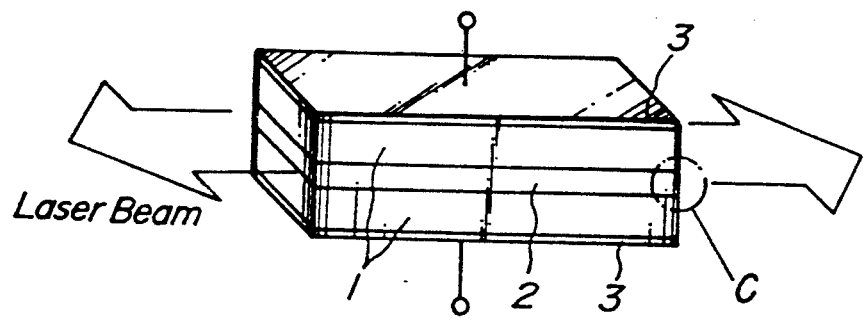
FIG_1C
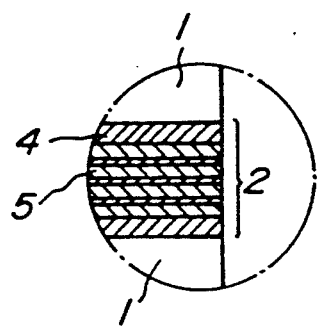

FIG_2
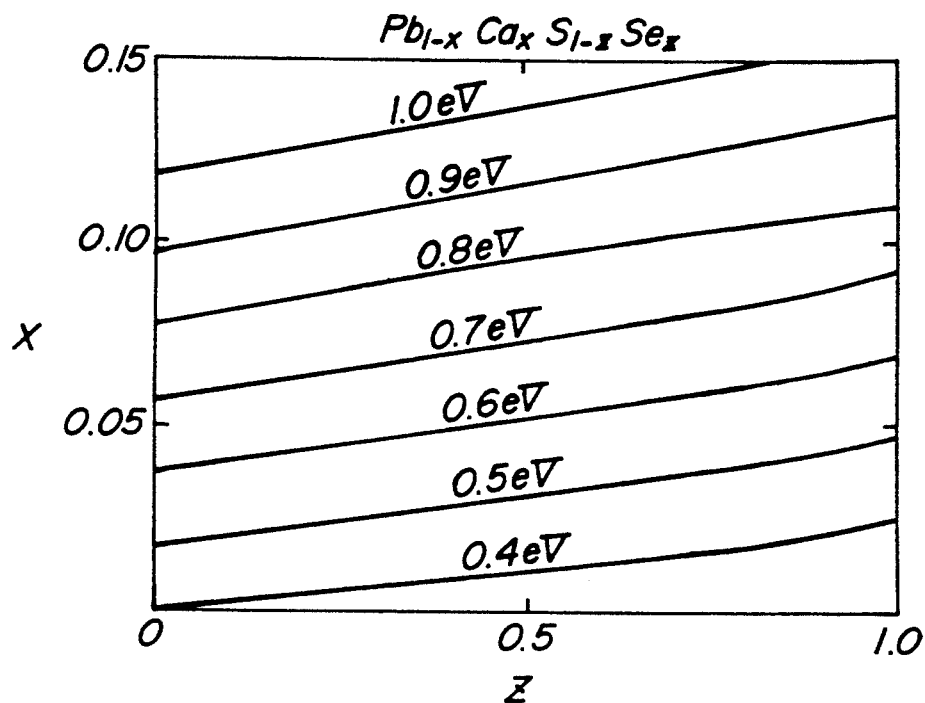
FIG_3
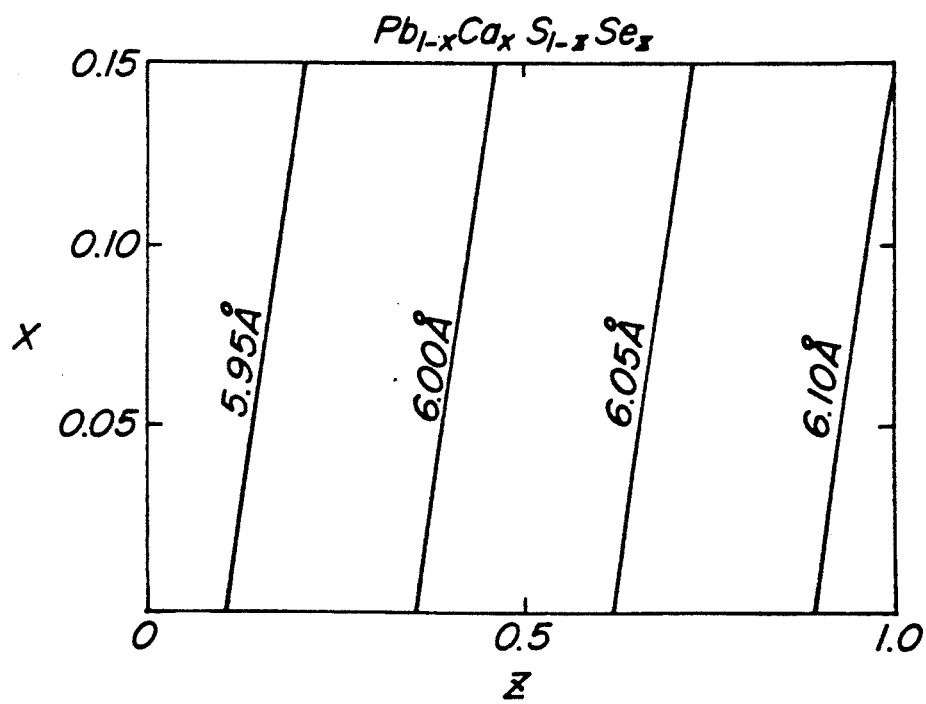

FIG_4
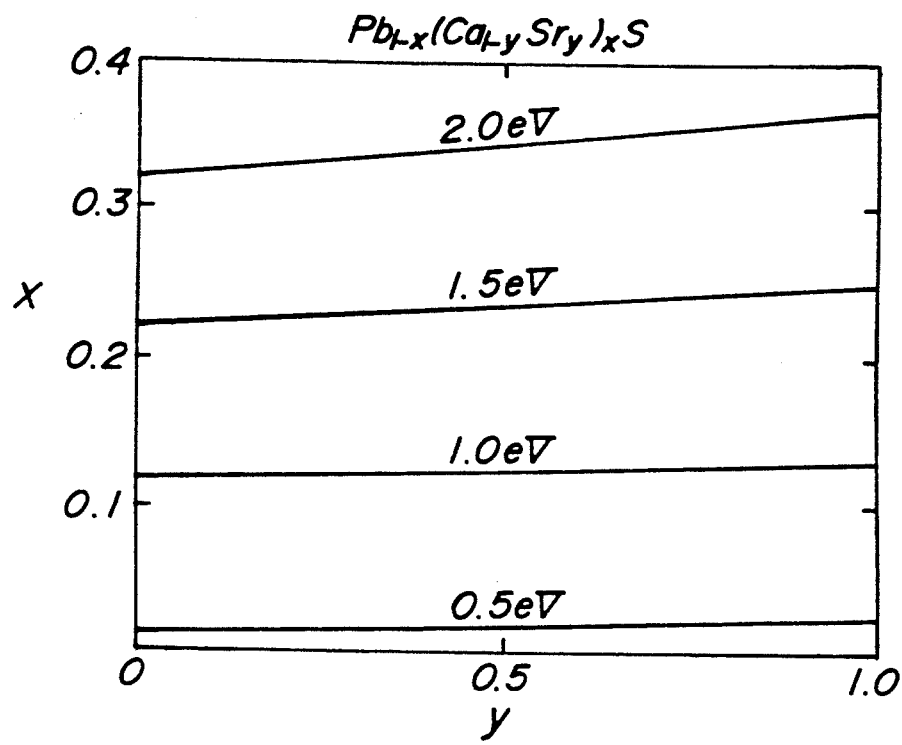
FIG_5
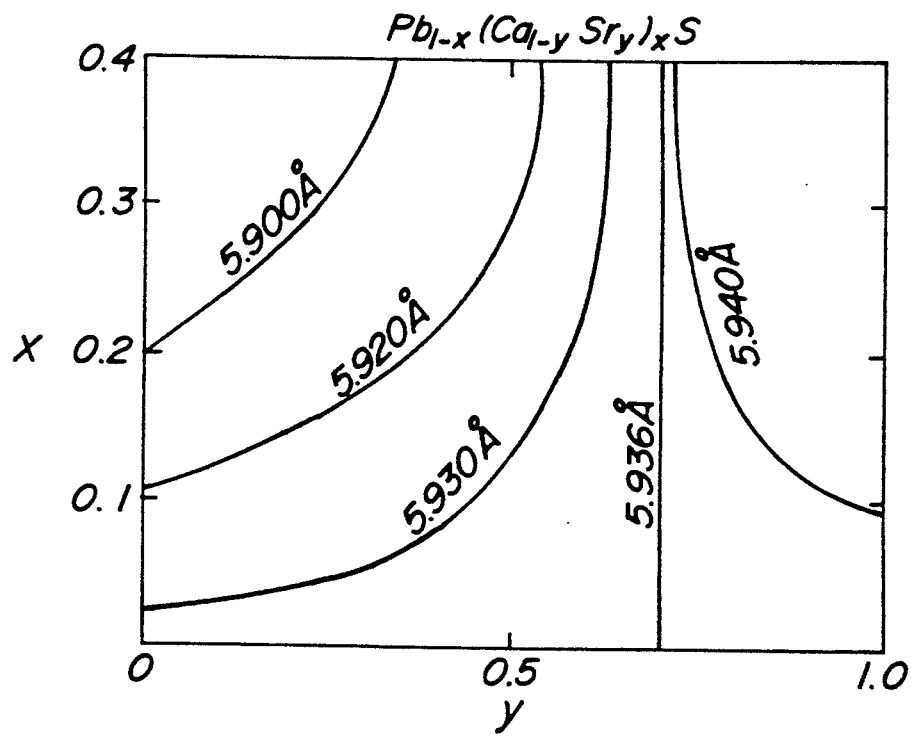

SOLID-SOLUTION SEMICONDUCTOR LASER ELEMENT MATERIAL AND LASER ELEMENT INCLUDING PB, CA AND S

BACKGROUND OF THE INVENTION

1. Field of the Invention

The present invention relates to a solid-solution semiconductor laser element material consisting of a solid-solution semiconductor having the general chemical formulae $Pb_{1-x}Ca_xX$, where $0<x\leq0.5$ and X is S or Se, and $Pb_{1-x}(Ca_{1-y}Y_y)_xX$, where $0<x\leq0.5$, $0<y<1$, and Y is Sr or Ba, which oscillates within a wide infrared region of wavelength of 0.4–8 μm, and is operable in the vicinity of room temperature. The present invention also relates to a laser element which uses this material.

An object of the present invention is to provide a solid solution semiconductor laser element material which can produce a laser element oscillating within an infrared region of wavelength of 0.4–8 μm, varying the wavelength and operating in the vicinity of a room temperature, particularly a laser element having a lattice matching type double hetero-structure or lattice matching type quantum well structure.

2. Description of the Prior Art

The structure of a semiconductor laser element is explained by referring to FIG. 1. FIGS. 1(A), 1(B) and 1(C) show a lattice matching type double hetero-structure laser element and a lattice matching type quantum well structure laser element, respectively, wherein a laser beam is emitted from an active layer 2 sandwiched by cladding layers 1, 1 in an arrow direction by flowing a current through electrodes 3.

In case of the semiconductor laser element, a laser beam is only faintly different from that of gas lasers, so that recent attempts have been made to increase luminous efficiency of a laser by using a complicated structure which divides an active layer into a barrier layer 4 and a quantum well 5 as shown in FIG. 1(C).

As a task required for the above-described semiconductor laser, it is important to increase an operating temperature and to have a good junction between a cladding layer and an active layer.

Known materials as an active layer and a cladding layer of a semiconductor laser element emitting laser beams with variable wavelength within an infrared region of wavelength of 0.4–8 μm are $Hg_{1-a}Cd_aTe$, where $0<a\leq1$, as a II–VI group compound semiconductor, InAs or InSb as a III–V group compound semiconductor and each kind of IV–VI group compound semiconductors.

From the view points of high operating temperature and the degree of wavelength variability, the IV–VI group compound semiconductor is noted as the most highly usable material in the above semiconductors, and there have hitherto been known $Pb_{1-a}Cd_aS_{1-b}Se_b$ or $Pb_{1-a}Eu_aTe_{1-b}Se_b$ and the like as a quaternary lead salt solid solution semiconductor.

A laser element is formed by making a cladding layer of $Pb_{1-a}Cd_aS_{1-b}Se_b$ or $Pb_{1-a}Eu_aSe_bTe_{1-b}$ by double hetero-structure substantially coincide with the charge carrier and the lattice constant of the cladding layer and the active layer wherein an active layer is formed by one element selected from the group consisting of PbS and $Pb_{1-a}Eu_aSe_bTe_{1-b}$. Operating temperatures are 200 and 241 K, respectively, but are attained by pulse oscillation, and they have a further shortcoming which is lowered by continuous oscillation and these cannot practically be used.

In general, in order to increase an operating temperature of the above-described injection-type semiconductor laser, it is desired that a laser element is formed by lattice matching type double hetero-structure or lattice-matching type quantum well structure coincide with each lattice constant of charge carrier and cladding layer and active layer, and that an energy gap of the cladding layer is larger than that of the active layer and its difference is sufficiently large. However, in either one of $Pb_{1-a}Cd_aS_{1-b}Se_b$ or $Pb_{1-a}Eu_aSe_bTe_{1-b}$, its difference is small, so that the low operating temperature is disadvantageous.

In the case of forming a laser element by lattice-matching type double hetero-structure or lattice-matching type quantum well structure, it is necessary to form a laser element by jointing materials having a larger energy gap of a cladding layer than that of an active layer, their large difference and substantially equal crystalline structures and lattice constants. In a general chemical formula of $Pb_{1-a}Cd_aS_{1-b}Se_b$ or $Pb_{1-a}Eu_aSe_bTe_{1-b}$ of a quarternary solid solution having a rock salt type crystalline structure, materials having different energy gaps and substantially equal lattice constants are obtained by separately controlling the composition (a) of an element of Cd or Eu and the composition (b) of an element of Se, so that it is possible to form a laser element by joining them.

However, in the case of actually manufacturing a laser element, a large amount of solid solution of Pb series cannot be expected from the limitation such as manufacturing condition and the like, and a quarternary solid solution is manufactured by a very small amount of solid solution at present. The above-described materials pulse-oscillated at 200 K and 241 K is understood that the compositions (a) of Cd and Eu in the above quarternary solid solution are 0.05 and 0.018, respectively, and a solid solution rate to Pb is small. Therefore, in case of producing them as a beam cladding layer, a difference between energy gaps of a cladding layer and an active layer is very small such as 0.18 (eV) at 300 K at most, 0.094 (eV) at 241 K, and a laser element having a high operating temperature cannot be obtained.

The demand for a highly efficient laser element has recently been increased, and it is particularly important to develop a solid solution semiconductor laser element operable in the vicinity of room temperature. That is, in order to increase an operating temperature of a semiconductor laser, it is an urgent task to obtain a novel solid solution semiconductor having a larger energy gap of a cladding layer than that of an active layer and a sufficiently large difference therebetween.

SUMMARY OF THE INVENTION

The present invention is made to obviate the above shortcomings by taking the above points into consideration. The present inventors have made various studies, and discovered that these problems can be solved by solid solving Ca to Pb. The characteristics of the present invention are as follows.

An object of the invention is to provide a solid solution semiconductor laser element material having the general chemical formula $Pb_{1-x}Ca_xX$ where, $0 < x \leq 0.5$, and X is at least one element selected from the group consisting of S, Se and Te.

Another object of the invention is to provide a solid solution semiconductor laser element material having the general chemical formula $$Pb_{1-x}(Ca_{1-y}Y_y)_xX$$

where, $0 < x \leq 0.5$, $0 < y < 1$, X is at least one element selected from the group consisting of Se and Te, and Y is at least one element selected from the group consisting of Sr and Ba.

Still another object of the invention is to provide a solid solution semiconductor laser element material having the general chemical formula $$Pb_{1-x}Ca_xS_{1-z}Se_z$$

where, and $0 < x \leq 0.4$, $0 \leq z \leq 1$.

Yet still another object of the invention is to provide a solid solution semiconductor laser element material having the general chemical formula $$Pb_{1-x}(CA_{1-y}Sr_y)_xS$$

where, and $0 < x \leq 0.5$, $0 \leq y \leq 1$.

Yet still another object of the invention is to provide a laser element wherein said material is used as a cladding layer and/or an active layer.

Yet still another object of the invention is to provide a double hetero-structure laser element wherein a material is used as a cladding layer and/or an active layer.

Another object of the invention is to provide a quantum well structure laser element wherein said material is used as a cladding layer and/or an active layer.

BRIEF DESCRIPTION OF THE DRAWING

For a better understanding of the invention, reference is made to the accompanying drawings, in which:

FIG. 1(A) is a laser element having a lattice matching type double hetero-structure.

FIG. 1(B) is a laser element having a lattice matching type quantum well structure.

FIG. 1(C) is an enlarged view of section C of FIG. 1(B).

FIG. 2 is a diagram showing the relation of the energy gap between compositions x and z of $Pb_{1-x}Ca_xS_{1-z}Se_z$ at room temperature.

FIG. 3 is a diagram showing the relation of the lattice constant between compositions x and z of $Pb_{1-x}Ca_xS_{1-z}Se_z$ at room temperature.

FIG. 4 is a diagram showing the relation of the energy gap between compositions x and y of $Pb_{1-x}(Ca_{1-y}Sr_y)_xS$ at room temperature.

FIG. 5 is a diagram showing the relation of the lattice constant between compositions x and y of $Pb_{1-x}(Ca_{1-y}Sr_y)_xS$ at room temperature.

DESCRIPTION OF THE PREFERRED EMBODIMENTS

The present invention will be explained in detail with respect to a method of manufacturing a solid solution semiconductor.

Each element is weighed into a desired composition ratio, and sealed in vacuo or a suitable gas atmosphere within a suitable vessel such as a quartz vessel. The vessel is inserted into a suitable oven, such as an electric oven or a suitable heating furnace, to be heated, melted and homogenized, and thereafter, quenched by water. The thus obtained sample is ground for further homogenization, and again sealed in vacuo or a suitable gas atmosphere such as argon (Ar) within a suitable vessel, such as a quartz vessel, heated at a high temperature for a suitable time, and quenched by water, and thereby a homogenized solid solution material is obtained. Moreover, the material is formed into a single crystal by a single crystal generating method, such as Bridgeman technique, a vapor phase reaction method and the like. On the other hand, this material is manufactured into a thin film having a suitably shaped thickness by using a thin film manufacturing device, such as MBE method, a HWE method and the like.

The present invention is explained in more detail by referring to the drawings. FIGS. 2 and 3 show a lattice constant obtained by X-ray powder diffraction method and an energy gap for compositions x, z and compositions x, y with respect to a single crystal of $Pb_{1-x}Ca_xS_{1-z}Se_z$ respectively. FIGS. 4 and 5 show a lattice constant obtained by X-ray powder diffraction method and an energy gap for compositions x, z and compositions x, y with respect to a single crystal of $Pb_{1-x}(Ca_{1-y}Sr_y)_xS$, respectively. Moreover, the energy gap and the lattice constant are obtained by processing at room temperature.

It is possible to select a combination of materials having a largely different energy gap, their large difference and equal lattice constant. That is, as a combination of a charge carrier in a lattice matching type double hetero-structure laser element or a lattice matching type quantum well structure laser element and materials as a beam cladding layer and an active layer, FIG. 2 shows, for example, that in the case of combining $Pb_{0.95}Ca_{0.05}S_{0.95}Se_{0.05}$ with PbB, their lattice constants become equal, and a large difference value of 0.24 eV of energy gap can be obtained. Therefore, the present invention can provide a lattice matching type double hetero-structure laser element or a lattice matching type quantum well structure laser element which can vary wavelength and can be operable at a temperature in the vicinity of room temperature.

When lattice missmatching occurs at the interface of an active layer and a cladding layer of a laser element, crystal defects such as dislocations are introduced into the active layer, the luminous efficiency is lowered, and the performance of the laser element is deteriorated, so that it is preferable that the lattice constants of the cladding layer and the active layer are almost equal, and matching is good.

The reason why the general chemical formulae of the materials according to the present invention are limited to $Pb_{1-x}Ca_xX$, where $0 < x \leq 0.5$, and X is at least one element selected from the group consisting of S, Se and Te, and $Pb_{1-x}(Ca_{1-y}Y_y)_xX$, where $0 < x \leq 0.5$, $0 < y < 1$, X is at least one element selected from the group consisting of S, Se and Te, and Y is at least one element selected from the group consisting of Sr and Ba is because if the general chemical formulae deviate from these composition ranges, the manufacture of a laser element becomes difficult, the operating temperature and luminous efficiency are lowered, and the material becomes unsuitable as laser element material. However, in the case of obtaining a solid solution semiconductor from the above stoichiometric composition, even if there is some deviation, use thereof as a laser element material is not spoiled. Moreover, Ca as a material of the present invention has a remarkable effect of widening a solid solution range with Pb and enlarging energy gap, and further the element selected from the group consisting of Sr, Ba, S, Se and Te has a large effect for controlling a lattice constant of a solid solution semiconductor.

EXAMPLE 1

With respect to a solid solution semiconductor of $Pb_{1-x}Ca_xS_{1-z}Se_z$ (x=0.02–0.06, z=0.20–0.80), raw materials of granular of Pb, Ca, S and Se of 99.999% purity were weighed to be gross weight 2 g at a desired composition ratio. They were vacuum sealed in a quartz vessel of 8 mm in inner diameter and 40 mm in length under a degree of vacuum of $1 \times 10^{-6}$ Torr, and a synthetic reaction preliminarily proceeded with a weak oxygen-hydrogen flame. Thereafter, the vessel was inserted into an electric oven heated to 1127 K (854° C.), maintained for about 10 minutes, thereafter the temperature was raised up to 1393 K (1120° C.) at a rate of 50 K/hr, the vessel was heated and maintained at the same temperature for 3 hours to homogeneously melt the contents, and quenched. The thus obtained material was further ground in a mortar, and vacuum sealed into a clean vessel of 8 mm in inner diameter and 50 mm in length and placed at one end. In order to prevent the agitation or unbalance of temperature distribution by an air flow within the oven, this vessel was further vacuum sealed in a quartz vessel to form a double sealing structure. This vessel was placed in a horizontal oven having a temperature gradient of 4 K of a temperature difference between sample temperature of 1223 K and that of a crystal growth portion, left for several days for single crystallization, and thereafter quenched to form a solid solution semiconductor laser material. Table 1 shows energy gaps and lattice constants of each of the thus obtained solid solution semiconductors. These values are well matched with energy gaps and lattice constants shown in FIGS. 2 and 3.

TABLE 1

| No. | Composition x | z | Energy gap (eV) | Lattice constant (Å) |
|---|---|---|---|---|
| 2 | 0.02 | 0.20 | 0.48 | 5.969 |
| 6 | 0.04 | 0.20 | 0.58 | 5.966 |
| 8 | 0.06 | 0.20 | 0.68 | 5.962 |
| 12 | 0.04 | 0.50 | 0.54 | 6.026 |
| 16 | 0.02 | 0.80 | 0.40 | 6.083 |
| 20 | 0.04 | 0.80 | 0.49 | 6.080 |
| 24 | 0.06 | 0.80 | 0.59 | 6.077 |

EXAMPLE 2

With respect to five kinds of a solid solution semiconductor of $Pb_{1-x}(Ca_{1-y}Sr_y)_xS$ (x=0.10–0.40, y=0.19–0.65), materials of granular of Pb, Ca, Sr and S of 99.999% purity were weighed to be gross weight 2 g at a desired composition ratio. The method of manufacturing each sample was the same as in Example 1. Energy gaps and lattice constants of each of the thus obtained solid solution semiconductors are as shown in Table 2. These values are well matched with energy gaps and lattice constants shown in FIGS. 4 and 5.

TABLE 2

| No. | Composition x | z | Energy gap (eV) | Lattice constant (Å) |
|---|---|---|---|---|
| 5 | 0.14 | 0.25 | 1.09 | 5.920 |
| 9 | 0.27 | 0.19 | 1.73 | 5.900 |
| 11 | 0.10 | 0.60 | 0.87 | 5.933 |
| 17 | 0.20 | 0.65 | 1.33 | 5.933 |
| 23 | 0.40 | 0.65 | 2.25 | 5.933 |

Table shows various properties in the case of using the typical solid solution semiconductor laser element materials obtained by the present invention as a laser element cladding layer and/or an active layer. Lattice constants of a cladding layer and an active layer are well matched, and a difference between their energy gaps (eV) is large. That is, it is understood that their difference is remarkably improved as compared with a comparative example having the highest value of 0.18 (eV) obtained by the prior art.

TABLE 3

| No. | Cladding layer Composition | Energy gap (eV) | Lattice constant (Å) | Active Layer Composition | Energy gap (eV) | Lattice constant (Å) |
|---|---|---|---|---|---|---|
| 32 | $Pb_{0.95}Ca_{0.05}S_{0.95}Se_{0.05}$ | 0.65 | 5.936 | PbS | 0.41 | 5.936 |
| 38 | $Pb_{0.95}Ca_{0.015}Sr_{0.035}S$ | 0.64 | 5.936 | PbS | 0.41 | 5.936 |
| 45 | $In_{0.95}Ga_{0.05}As_{0.48}P$ | 0.85 | 5.936 | $Pb_{0.95}Ca_{0.05}S_{0.95}Se_{0.05}$ | 0.65 | 5.936 |
| 49 | $In_{0.95}Ga_{0.05}As_{0.48}P$ | 0.85 | 5.936 | $Pb_{0.95}Ca_{0.015}Sr_{0.035}S$ | 0.64 | 5.936 |
| 53 | $Pb_{0.9}Ca_{0.1}S_{0.92}Se_{0.08}$ | 0.90 | 5.936 | $Pb_{0.95}Ca_{0.05}S_{0.95}Se_{0.05}$ | 0.65 | 5.936 |
| 59 | $Pb_{0.90}Ca_{0.03}Sr_{0.07}S$ | 0.87 | 5.936 | $Pb_{0.95}Ca_{0.015}Sr_{0.035}S$ | 0.64 | 5.936 |
| 62 | $Pb_{0.89}Ca_{0.09}Ba_{0.02}S$ | 0.93 | 5.936 | PbS | 0.41 | 5.936 |
| 70 | $Pb_{0.95}Ca_{0.05}Se_{0.97}Te_{0.03}$ | 0.51 | 6.124 | PbSe | 0.28 | 6.124 |
| 75 | $Pb_{0.89}Ca_{0.06}Sr_{0.02}Ba_{0.03}S$ | 0.90 | 5.936 | PbS | 0.41 | 5.936 |
| 85 | $Pb_{0.90}Ca_{0.10}S_{0.92}Se_{0.05}Te_{0.03}$ | 0.89 | 5.936 | PbS | 0.41 | 5.936 |
| Comparative Example | $Pb_{0.95}Cd_{0.05}S_{0.89}Se_{0.11}$ | 0.59 | 5.936 | PbS | 0.41 | 5.936 |

As apparent from Table 3, Sample Nos. 45 and 49 are the case of using the material of the present invention as an active layer, and Sample Nos. 53 and 59 show the case of using the material of present invention for both the cladding layer and the active layer. The other samples show the case of using the material of the present invention for a cladding layer. The material according to the present invention, depending on the composition, may be preferable for a cladding layer, an active layer and both the cladding layer and the active layer, and it was confirmed that the energy gap and the lattice constant are within a predetermined range.

As shown in the above Examples, Tables and drawings, the solid solution semiconductor laser element material according to the present invention is a suitable material for a laser element because of a wide solid solution range and a large energy gap. That is, with the use of the present material as a cladding layer, and an active layer is suitably selected from a solid solution semiconductor, such as PbS, PbSe, PbTe, $PbS_{1-z}Se_z$ and the like, having smaller energy gap than that of the cladding layer, its difference being large, substantially the same lattice constants and good lattice matching. Alternatively, a cladding layer can be suitably selected from a solid solution semiconductor, such as $In_{1-x}Ga_x As_{1-y}P_y$ and the like, having a large energy gap, and an active layer can be suitably selected from the present material having a smaller energy gap than that of the cladding layer, its difference being large, and good lattice matching. Further, both the cladding layer and the active layer can be suitably selected from the material according to the present invention having a larger energy gap of a cladding layer than that of an active layer, its large difference being large and good lattice matching, thereby forming a high laser element having high operating temperature and luminous efficiency. Therefore, the laser element of the present invention is suitable for not only a light source of an ultra-high resolution spectroscope within an infrared region of wavelength 0.4–8 μm or quartz glass fiber optical communication used in optical communication at present, but also a light source of optical communication with the use of metal halide polar loss glass fiber having less optical loss in development.

The material according to the present invention can easily form a laser element which oscillates within an infrared region of wavelength range of 0.4–8 μm and the material can vary wavelength and it is operable in the vicinity of room temperature, particularly a lattice matching type double hetero-structure or lattice matching type quantum well structure laser element, so that it is suitable as material of a highly luminous efficient and high-performance laser element. Furthermore, this laser element is suitable as a light source and the like for optical communication systems, ultra-high resolution spectroscopes and other general instruments, and the applicable range of the present material is wide.

What is claimed is:

1. A solid solution semiconductor laser element material having the general chemical formula $$Pb_{1-x}Ca_xX$$

wherein, $0<x\leq0.5$, X comprises S.

2. The material of claim 1, wherein X further comprises at least one of Se and Te.

3. A laser element including a cladding layer and an active layer, wherein at least one of said layers comprises the material of claim 2.

4. A double hetero-structure laser element including a cladding layer and an active layer, wherein at least one of said layers comprises the material of claim 2.

5. A quantum well structure laser element including a cladding layer and an active layer, wherein at least one of said layers comprises the material of claim 2.

6. A laser element including a cladding layer and an active layer, wherein at least one of said layers comprises the material of claim 1.

7. A double hetero-structure laser element including a cladding layer and an active layer, wherein at least one of said layers comprises the material of claim 1.

8. A quantum well structure laser element including a cladding layer and an active layer, wherein at least one of said layers comprises the material of claim 1.

9. A solid solution semiconductor laser element material having the general chemical formula $$Pb_{1-x}(Ca_{1-y}Y_y)_xX$$

wherein, $0<x\leq0.5$, $0<y<1$, X comprises at least one element selected from the group consisting of S, Se and Te and Y comprises at least one element selected from the group consisting of Sr and Ba.

10. A laser element including a cladding layer and an active layer, wherein at least one of said layers comprises the material of claim 9.

11. A double hetero-structure laser element including a cladding layer and an active layer, wherein at least one of said layers comprises the material of claim 9.

12. A quantum well structure laser element including a cladding layer and an active layer, wherein at least one of said layers comprises the material of claim 9.

13. A solid solution semiconductor laser element material having the general chemical formula $$Pb_{1-x}Ca_xS_{1-z}Se_z$$

where, $0<x\leq0.4$, $0\leq z<1$.

14. A laser element including a cladding layer and an active layer, wherein at least one of said layers comprises the material of claim 13.

15. A double hetero-structure laser element including a cladding layer and an active layer, wherein at least one of said layers comprises the material of claim 13.

16. A quantum well structure laser element including a cladding layer and an active layer, wherein at least one of said layers comprises the material of claim 13.

17. A solid solution semiconductor laser element material having the general chemical formula $$Pb_{1-x}(Ca_{1-y}Sr_y)_xS$$

wherein, $0<x\leq0.5$, and $0\leq y<1$.

18. A laser element including a cladding layer and an active layer, wherein at least one of said layers comprises the material of claim 17.

19. A double hetero-structure laser element including a cladding layer and an active layer, wherein at least one of said layers comprises the material of claim 17.

20. A quantum well structure laser element including a cladding layer and an active layer, wherein at least one of said layers comprises the material of claim 17.

* * * * *